(12) United States Patent
Tanabe et al.

(10) Patent No.: US 6,469,320 B2
(45) Date of Patent: Oct. 22, 2002

(54) SEMICONDUCTOR LIGHT EMITTING DEVICE

(75) Inventors: Tetsuhiro Tanabe; Masayuki Sonobe, both of Kyoto (JP)

(73) Assignee: Rohm, Co., Ltd., Kyoto (JP)

( * ) Notice: Subject to any disclaimer, the term of this patent is extended or adjusted under 35 U.S.C. 154(b) by 0 days.

(21) Appl. No.: 09/864,275

(22) Filed: May 25, 2001

(65) Prior Publication Data

US 2002/0005521 A1 Jan. 17, 2002

(30) Foreign Application Priority Data

May 25, 2000 (JP) ........................................ 2000-154461
Jun. 23, 2000 (JP) ........................................ 2000-190320

(51) Int. Cl.[7] ........................ H01L 27/15; H01L 31/12; H01L 33/00
(52) U.S. Cl. ........................ 257/79; 257/13; 257/14
(58) Field of Search ........................ 257/79, 13, 14, 257/89

(56) References Cited

U.S. PATENT DOCUMENTS 5,981,977 A * 11/1999 Furukawa et al. ............ 257/94
6,015,979 A * 1/2000 Sugiura et al. ............... 257/86
6,111,277 A * 8/2000 Ikeda ........................... 257/13
6,312,967 B1 * 11/2001 Ikeda ........................... 438/22

* cited by examiner

Primary Examiner—David Nelms
Assistant Examiner—Andy Huynh
(74) Attorney, Agent, or Firm—Arent Fox Kintner Plotkin & Kahn, PLLC

(57) ABSTRACT

A first GaN layer (2) is formed on a substrate (1), mask layer (3) having opening parts (3a) are formed thereon, a second GaN layer (4) is selectively grown in the lateral direction from the opening parts on the mask layer, and further a nitride type compound semiconductor layered part (15) is so laminated as to form a light emitting layer. Recessed parts (3b) are formed in the upper face side of the mask layer. In other words, owing to the recessed parts in the upper face side of the mask layer, the second GaN type compound semiconductor layer (4) is grown as to form approximately parallel gap (3c) between the bottom face of the second GaN type compound semiconductor layer and the mask layer. Further, it is preferable for the mask to be formed in a manner that the opening parts for exposing the seeds are not arranged only continuous in one single direction in the entire surface of the wafer type substrate. Consequently, a nitride type compound semiconductor light emitting device can be obtained while being provided with a low dislocation density and excellent light emitting efficiency and especially a semiconductor laser with a lowered threshold current value can be obtained.

10 Claims, 7 Drawing Sheets

SEMICONDUCTOR LIGHT EMITTING DEVICE

FIELD OF THE INVENTION

The present invention relates to a semiconductor light emitting device such as a semiconductor laser, a light emitting diode or the like and a fabrication method thereof, which uses a nitride-based compound semiconductor (a compound semiconductor of group III element(s) and nitrogen and the like), and is capable of emitting light in the blue color region required for an optical disk memory having a high memory density or improving delicacy of a laser beam printer. More particularly, the present invention relates to a semiconductor light emitting device such as a semiconductor laser and a fabrication method thereof capable of preventing warp in a wafer while suppressing the threading dislocation (defect) density of a nitride-based compound semiconductor layer as much as possible by employing epitaxial lateral overgrowth and of improving the electroluminescent properties.

BACKGROUND OF THE INVENTION

A conventional light emitting diode (LED) or laser diode (LD) emitting light in a blue-emitting region has been fabricated by successively forming compound semiconductor of group III element nitrides on a sapphire substrate by Metal Organic Chemical vapour Deposition (hereinafter referred to as MOCVD).

For example, a semiconductor laser capable of carrying out CW oscillation in a blue-emitting region is fabricated as shown in FIG. 10 by successively forming layers of group III element nitride type compound semiconductor on a sapphire substrate 21 by the MOCVD method; a GaN buffer layer 22, a contact layer 23 of an n-type GaN, an n-type clad layer 24 of $Al_{0.12}Ga_{0.88}N$, an n-type light guide layer 25 of GaN, an active layer 26 of an InGaN based (type) compound semiconductor with multiple quantum well structure, a p-type light guide layer 27 of a p-type GaN, a p-type clad layer 28 of a p-type $Al_{0.12}Ga_{0.88}N$, and a p-type contact layer 29 of a p-type GaN; etching some of the layered semiconductor layers as shown in FIG. 10 by, for example, dry etching to expose the n-type contact layer 23, and forming an n-side electrode 31 thereon and a p-side electrode 30 on the foregoing p-type contact layer 29, respectively. The portion of the p-side electrode 30 along the stripes is utilized as the light emitting part.

However, the sapphire substrate on which the nitride based compound layers are grown has considerably different lattice constant and thermal expansion coefficient from those of the nitride type compound semiconductor layers and the density of the threading dislocation (TD) of the nitride based compound semiconductor layers grown thereon is as high as about $1 \times 10^8$ $cm^{-2}$ to $1 \times 10^{10}$ $cm^{-2}$ and the dislocation density is significantly high as compared with that, $1 \times 10^2$ $cm^{-2}$, of compound semiconductor layers of the red-emitting type grown on GaAs substrate. In case of LEDs (light emitting diode), even if there occurs dislocation density about that level, a compound semiconductor is practically applicable, however in case of semiconductor lasers, if the dislocation density is especially high, the threshold current is increased, so that it is desired to lower the dislocation density at highest to about $1 \times 10^7$ $cm^{-2}$ or lower in order to obtain a low threshold value and a long life. However, other than sapphire, any alternative substrate suitable for industrial use has not been found.

On the other hand, as a technique to lower the TD, crystal growth using ELO (epitaxial lateral overgrowth) has drawn attention as crystal growth methods, as disclosed in for example, "Thick GaN Epitaxial Growth with Low Dislocation Density" by Akira Usui et al. (Jpn. J. Apply. Phys., vol. 36, 1997, pp. 899–902) and "ELO growth of GaN by hydride VPE and MOVPE" by Sasaoka et al. (Jpn. J. Crystal Growth, vol. 25 no. 8, 1998, pp. 99–105).

These methods are methods including, for example, steps of putting a $SiO_2$ mask 43 having opening parts 44 on a first GaN layer 42 on a sapphire substrate 41 and growing a second GaN layer 45 on the $SiO_2$ mask 43 by selectively growing the layer in the lateral direction using the semiconductor layer exposed to the opening parts 44 as a seed as its sectional explanatory view is partially shown in FIG. 11 and prevent TD based on that a nitride type compound is easier to be grown in the lateral direction than in the vertical direction. The literature cited in the former journal discloses that a mirror face GaN layer free from cracks and having the dislocation density of lower than $6 \times 10^7$ $cm^{-2}$ can be grown on a sapphire wafer with the diameter of 2 inch by the forgoing method.

However, in case of ELO growth, as shown in FIG. 11, although the second GaN layer 45 is so grown successively in the lateral direction from opening parts 44 in both sides formed at constant intervals in the mask layer 43 on the first GaN layer 42 as to meet in the center part of the mask layer 43, the second GaN layer 45 growing on the mask 43 tends to be lifted out of the mask 43 as it goes to the center part side and is grown while the crystallographic axis being curved to result in that the second GaN layer 45 cannot have a flat bottom face and surface. Therefore, as shown in FIG. 11, a void 46 is formed owing to the join of the second GaN layer 45 in the center part side of the mask while the second GaN layer 45 being lifted out and it is undesirable to fabricate a device using the resultant wafer. Such tendency further become significant if the mask width M becomes wide.

In order to avoid deterioration of the flatness, for example, as it can be understood from the case of the method cited in the literature of the above mentioned former journal where the mask width M of the $SiO_2$ mask is 1 to 4 $\mu$m and the cycle (M+W) is about 7 $\mu$m, the mask width M is required to be narrow since the void 46 is easily formed if the mask width M is 3 $\mu$m or wider. Moreover, as the width M becomes wider, the height and the size of the void become high and large and consequently, the flatness of the surface is deteriorated to result in inferiority of device properties. Further, even if the ultimate conditions in which no void 46 is formed and the flatness is barely kept, the dislocation density is increased in the join part in the center. Furthermore, the second GaN layer 45 growing in the opening parts 44 also has threading dislocation continuous as it is from the first GaN layer 42 in the vertical direction to become a region with a high dislocation density. Therefore, the continuous parts with a small dislocation density are only obtained in a half of the mask width and more precisely in portions excluding both end parts of the half and within about 1 $\mu$m by width.

Nevertheless, in case of using the obtained wafer for a stripe type semiconductor laser, the light emitting part of the laser is only some region which is stripe-like and therefore it is supposed to be possible for the semiconductor laser to suppress the increase of threshold current value attributed to the crystal defects and the deterioration of electric operating properties of LD by lowering the dislocation density of the corresponding part of the semiconductor layer. In this case, as shown in FIG. 9, although it is effective to reciprocally form the opening parts 44 and mask layer 43 linearly in one direction, the dislocation density becomes high as described above in the both end parts and the center parts in the mask width and it is therefore preferable to use the portion excluding both end parts in a half of the mask width for a light emitting region with a stripe width of LD. Hence, supposing the stripe width of the LD to be 4 to 5 μm, the mask width M is required to be at least 10 to 15 μm and in this case, the GaN to be grown on the mask is required to be grown thicker than the mask width, that is 15 to 20 μm.

As described before, in order to fabricate a semiconductor laser device with few crystal defects even only in the light emitting part of the device, it is required to form opening parts in the mask along the stripe direction in which the light emitting part of the device is formed and as shown in FIG. 9, the opening parts are formed in the mask only in one direction. On the other hand, there occurs no problem in case of a thin layered structure comprising a mask with a narrow width and the GaN layer with about 5 μm thickness grown on the mask, however if the mask width is 10 μm or wider and the thickness of a semiconductor layer to be layered thereon is 15 μm or thicker, the warp of a wafer becomes significant attributed to the difference of the thermal expansion coefficient between the semiconductor layer and the substrate. In the case where the wafer is warped, uniform treatment in the wafer cannot be carried out during the wafer process, resulting in problems that the stripe width cannot be even, cracking easily takes place at the time of wrapping the wafer, and that properties are easy to be varied owing to the effect of the stress on the device by the warp.

On the other hand, if the thickness of the substrate is made as thick as about 700 μm from the conventional thickness, about 330 μm, such problems in the wafer process are eliminated, however there occurs another problem that the final polishing of the substrate before the substrate is made a chip requires a burdensome work and also if the substrate is polished the foregoing warping problem takes place. Further, Japanese Unexained Patent Publication No. Hei 11-186178 gazette discloses a method to prevent the wafer from warping owing to the difference of the thermal expansion coefficient from that of the substrate by employing the foregoing ELO growth and forming the grown regions like islands without carrying out epitaxial growth of a semiconductor layer on the entire surface of the substrate (no growth takes place by forming a large mask in a non-growth region). However, by this method, at least a half of the wafer is the non-growth region as examples show to leave a problem that the wafer is utilized considerably in vain.

SUMMARY OF THE INVENTION

The present invention has been developed in the above described situation and a first object of the present invention is to provide a nitride type compound semiconductor light emitting device with a high light emitting efficiency by selectively forming a nitride type compound semiconductor layer with flatness in a wide range on a mask of $SiO_2$ or the like while suppressing the dislocation density.

Another object of the present invention is to provide a semiconductor laser capable of providing high outputs by suppressing the dislocation density of the active layer in at least stripe-like light emitting region and lowering the threshold current value in the case where the light emitting region can be restricted within the stripe-like part just as the case of a semiconductor laser.

Further another object of the present invention is to provide a semiconductor laser with a structure possible to prevent warp of a wafer while suppressing the dislocation density of the active layer in such stripe-like light emitting region.

Further another object of the present invention is to provide a method for fabricating a semiconductor light emitting device by which the warp of a wafer is suppressed to the extent that there occurs no problem in the device properties and the handling of the wafer while the threading dislocation density of the entire wafer being suppressed by widening the mask width in the case where a semiconductor layer is selectively grown on the mask by ELO growth.

Inventors of the present invention have enthusiastically investigated in order to solve a problem that a growing nitride type compound semiconductor layer is grown while the crystallographic axis being warped more upward as it goes closer to the center part of a mask to leave a void in the periphery of the center part in case of selective growth of the semiconductor layer on the mask in the lateral direction and that the void becomes bigger as the mask width is wider to inhibit growth of the flat semiconductor layer, and inventors have found the reason why the upward warping of the crystallographic axis of the growing semiconductor layer is getting more significant as the semiconductor layer is grown closer to the center part side of the mask is attributed to the contact stress affecting the contact parts of the semiconductor layer and the mask layer. Inventors have also found that a flat semiconductor layer with a small dislocation density can be grown without being accompanied with the warp of the crystallographic axis by parting the contact parts and contact stress is prevented from affecting.

A semiconductor light emitting device according to the present invention comprises a substrate, a mask layer having opening parts and formed directly on the substrate or on a layer formed on the substrate, a nitride type compound semiconductor layer selectively grown in the lateral direction on the mask from the opening parts, and a semiconductor layered part comprising nitride type compound semiconductor layers so formed on the nitride type compound semiconductor layer as to form light emitting layer, wherein the mask layer is provided with at least one recessed part on the upper face side, or the foregoing second nitride type compound semiconductor layer has a flat fade in the bottom face side and is so grown as form an approximately parallel gap between to the bottom face of the second nitride type compound semiconductor layer and the mask layer.

In this case, the nitride type compound semiconductor denotes a semiconductor of a compound of group III elements such as Ga, Al, In and the like, and N and other elements of group V elements. Consequently, the compound semiconductor means N-containing compound semiconductor with properly changed mixed crystal ratio of the group III elements and of the group V elements, such as AlGaN type compound in which the composition ratios of Al and Ga can be changed, InGaN type compound in which the composition ratio of In and Ga can be changed, other than GaN. Further, the mask layer means a layer made of a material, for example, $SiO_2$, on whose surface an epitaxial growth of a nitride type compound semiconductor layer cannot directly be carried out in case of trying the epitaxial growth.

According to such a structure, since recessed parts are formed in the mask layer to be an underlayer of the second nitride type compound semiconductor layer selectively grown in the lateral direction, or the second nitride type compound semiconductor layer is formed as to keep a gap to the mask layer, a second gallium nitride type compound semiconductor layer to be grown is not affected with the stress from the mask layer. As a result, the crystallographic axis of the second gallium nitride type compound semiconductor layer is prevented from upward warping as the compound semiconductor layer is growing in the lateral direction and the semiconductor layer is straightly grown in the lateral direction in a wide width to obtain the second nitride type compound semiconductor layer excellent in flatness and having an extremely low dislocation density. Further, since the semiconductor layered part of the nitride type compound layered thereon is grown on the semiconductor layer with a low dislocation density, it is made possible to form the semiconductor layered part with excellent flatness and a low dislocation density.

The layer to be formed on the foregoing substrate may be a first nitride type compound semiconductor layer and the foregoing nitride type compound semiconductor layer to be formed on the foregoing mask layer may be a second nitride type compound semiconductor layer.

A semiconductor laser of the present invention is the foregoing nitride type compound semiconductor light emitting device in the above described in claim 1 or 2, wherein the semiconductor layered part is laminated so as to constitute a semiconductor laser structure, the mask layer has a part extended like stripe by being sandwiched between neighboring opening parts, the recessed part or the gap is formed in a prescribed width along the stripe in the part extended like stripe, and the semiconductor layered part is so formed that a current injection region in stripe is formed in a constant width within a half of the prescribed width. By constituting such a structure, without requiring semiconductor layers with a low dislocation density to be formed in a wide range, the semiconductor layered part necessary in light emitting region in stripe comprises only layers with a low dislocation density and can be formed as to have excellent flatness and it is thus made possible to obtain a semiconductor laser with a small threshold current value, a high output and excellent reliability.

Further, inventors of the present invention have made investigation in order to eliminate the effect of the wafer's warp attributed to the wide width of the mask and the thick thickness of the nitride type compound semiconductor layer grown thereon in case of selective growth (ELO growth) of the nitride type compound semiconductor layer on the mask in the lateral direction and consequently found that if opening parts of the mask layer are formed continuously only in one direction, the warp takes place in a constant direction in relation to the opening parts and that, on the contrary, if most parts of the opening parts are dispersed or the opening parts are not formed to be continuous only in one direction, the warp can significantly be suppressed even if the thickness of the growing layer is made thick by widening the mask width or even if long and straightly linear opening parts are formed.

A method for manufacturing a semiconductor light emitting device according to the present invention comprises the steps of; forming a mask layer, on which a nitride type compound semiconductor layer cannot be formed directly, either directly on the surface of a wafer-type substrate or on a layer formed on the substrate; forming opening parts for exposing seeds to grow nitride type compound semiconductor layer layers in the mask in a manner that the opening parts are not arranged only continuous in a single direction in the entire surface of the foregoing wafer-type substrate; forming a nitride type compound semiconductor layer on the entire surface of the foregoing wafer-type substrate by selectively growing the layer on the foregoing mask layer from the opening parts in the lateral direction; forming a semiconductor layered part comprising nitride type compound semiconductor layers as to form light emitting layer on the foregoing nitride type compound semiconductor layer; and producing chips from the resultant wafer type substrate.

According to the present method, since the opening parts of the mask layer are not formed continuously only in one direction, the stress owing to the difference of the thermal expansion coefficient between the substrate and the semiconductor layers grown thereon does not affect only in one direction but evenly applied in every direction to result in prevention of significant warp in only one direction. Consequently, treatment unevenness in wafer processing process and cracking of the wafer can be avoided to considerably improve the quality of the resultant product.

Most of the foregoing opening parts are formed to be a rectangular or hexagonal shape in a plan view, so that the length in the growth direction can be easy to be adjusted even if the speed of the crystal growth in the lateral direction is different between the direction perpendicular to the A face and the direction perpendicular to the M face in case of the rectangular shape and the growth speeds in the respective directions can be made equal one another due to that a GaN type compound is of a hexagonal system in case of the hexagonal shape, so that the growth in the lateral direction can be made even. That most of the opening parts are formed to be a rectangular or hexagonal shape in this case includes that straightly linear opening parts formed partially, for example, in the peripheries of the stripe-like light emitting parts of an LD.

Another embodiment of the semiconductor laser according to the present invention is a semiconductor laser comprising; a substrate, a mask layer having opening parts and formed directly on the substrate or on a layer formed on the substrate, a nitride type compound semiconductor layer selectively grown in the lateral direction on the mask layer from the opening parts, and a semiconductor layered part comprising nitride type compound semiconductor layers so formed on the nitride type compound semiconductor layer as to form a light emitting layer having a stripe type light emitting part, wherein the mask layer has a part extended in the entire chip length with no opening part transversely crossing the lower side of the stripe type light emitting part and has the opening parts dispersedly in the parts other than the lower side of the stripe type light emitting part.

Owing to such a structure, the stripe type light emitting part of the semiconductor laser are composed of only parts with extremely few crystal defects and since the opening parts of the mask layer are not formed only in one direction, the warp of the wafer can be suppressed to a significantly low level and the production yield is improved and at the same time the obtained semiconductor laser is provided with excellent properties and a low threshold current.

More practically, the opening parts of the mask layer are formed linearly along the stripe type light emitting part in the portions adjacent to the stripe type light emitting part and formed in a matrix-like form or randomly in the portions other than the portions adjacent to the stripe type light emitting part or the mask layer is formed into a shape symmetric three times by layering a first pattern having linear opening parts, a second pattern obtained by rotating the first pattern at 60°, and a third pattern obtained by rotating the first pattern at 120°, so that the opening parts of the mask layer are not restricted only to those continuous only in one direction and the semiconductor laser having the stripe type light emitting part can be formed by semiconductor layers with a low dislocation density entirely in the stripe type light emitting part.

DETAILED DESCRIPTION

Figure 1:
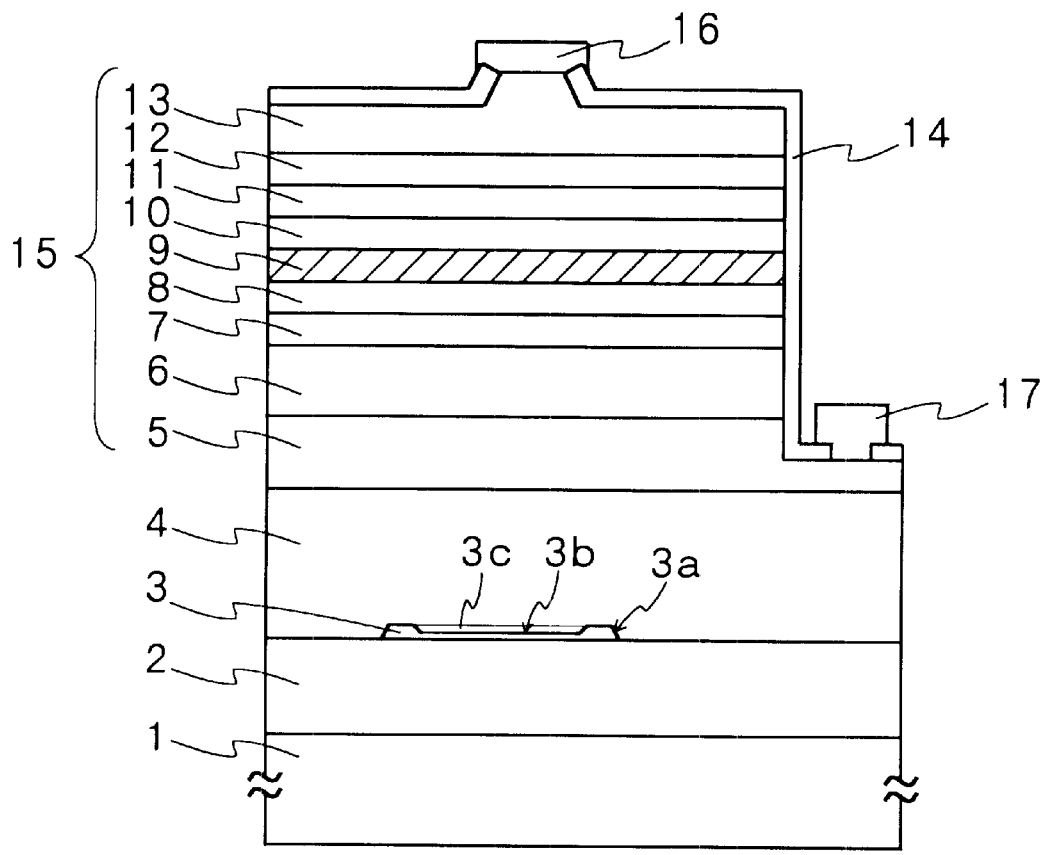
FIG. 1 is a explanatory sectional view of one embodiment of a semiconductor laser according to the present invention.

Next, a semiconductor light emitting device of the present invention will be described with the reference to Figs. As shown in FIG. 1 as a explanatory view of a semiconductor laser, which is one embodiment, the semiconductor light emitting device according to the present invention comprises a first nitride type compound semiconductor layer 2 on a substrate 1, mask layer 3 having opening parts 3a formed thereon, a second nitride type compound semiconductor layer 4 formed on the mask layer 3 by being selectively grown in the lateral direction from the opening parts 3a, and a semiconductor layered part 15 composed of layered nitride type compound semiconductor layers as to form light emitting layer. Recessed parts 3b are formed on the upper face side of the mask layer 3. In another structure, owing to the recessed parts 3b on the upper face side of the mask layer 3, the second nitride type compound semiconductor layer 4 is so formed to be a flat face in the bottom face side and the second nitride type compound semiconductor layer 4 may be grown as to form a gap 3c approximately parallel between the bottom face of the second nitride type compound semiconductor layer 4 and the mask layer 3.

As the substrate 1, for example, a sapphire ($Al_2O_3$ single crystal) substrate capable of standing a high temperature can be employed, however not only sapphire but also other semiconductor substrates of such as Si, Ge and the like can be employed. In any case of using any one of the materials, the lattice constant is not equal to that of GaN, so that lattice conformation cannot be achieved. However, selective growth in the lateral direction through the mask layer makes it possible to grow a semiconductor layer with a small dislocation density on the mask layer.

The first nitride type compound semiconductor layer 2 is formed, for example, by a common epitaxial growth of a non-doped GaN in about 4 $\mu$m by a MOCVD method and is to be employed as a seed at the time of selective growth of the second nitride type compound semiconductor layer 4, which will be described later. Nevertheless, if it is possible to carry out nitride type compound semiconductor layer growth using a semiconductor substrate of such as Si or a sapphire substrate as a seed even in the case where the first nitride type compound semiconductor layer is not formed, the first semiconductor layer can be omitted.

Figure 2:
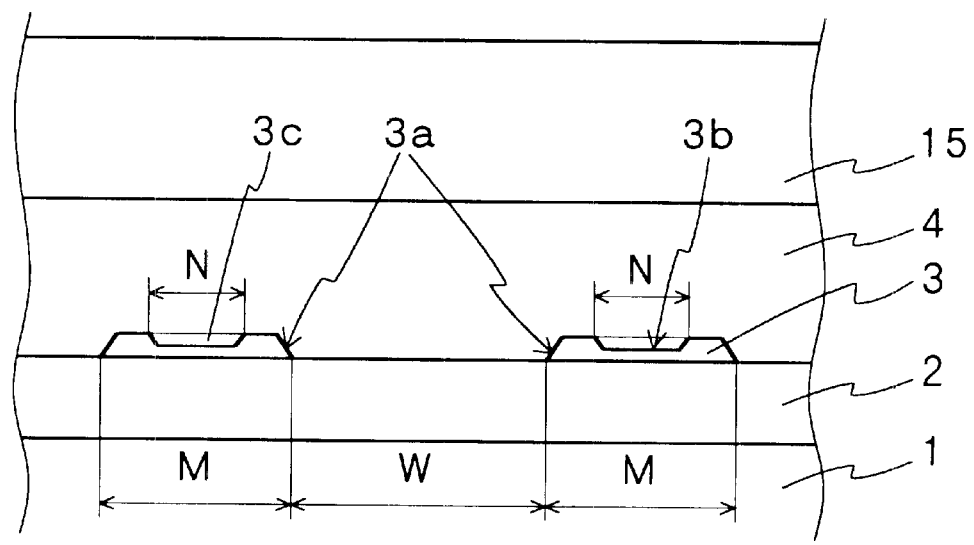
FIG. 2 is a explanatory sectional view of mask layer part of FIG. 1 in the wafer state.

The mask layer 3 is formed in about 200 nm thickness by sputtering a material, for example, $SiO_2$, $Si_3N_4$, W or the like, on which a semiconductor layer cannot directly epitaxially be grown. The mask layer 3 is for avoiding the second semiconductor layer from directly being formed on the surface of the substrate 1 or the first GaN layer 2 and as long as it is formed as to satisfactorily perform the function as a mask, the mask layer is more preferable to be thinner since steps are hardly formed if it is thin. As shown in FIG. 2 showing a partial explanatory sectional view of wafer state, the mask layer 3 is provided with the opening parts 3a by patterning after it is formed on the entire surface of the first nitride type compound semiconductor layer 2 in the wafer state and further with recessed parts 3b formed along the opening parts 3a in the surface side of the remaining mask layer 3.

In the case of fabricating a semiconductor laser shown in FIG. 1, the width W of the opening parts 3a is about 10 to 20 $\mu$m and the width M of the mask layer 3 is about 20 $\mu$m. According to the present invention, even if the mask width, about 20 $\mu$m, is widened, the second semiconductor layer 4 with a flat surface can be formed. In FIG. 1, since the stripe parts and the mask layer 3 are shown being magnified, only a part of mask layer 3 is shown, however actually a large number of parts of mask layer 3 are formed in one chip in reciprocal foregoing M and W intervals.

Figure 3:
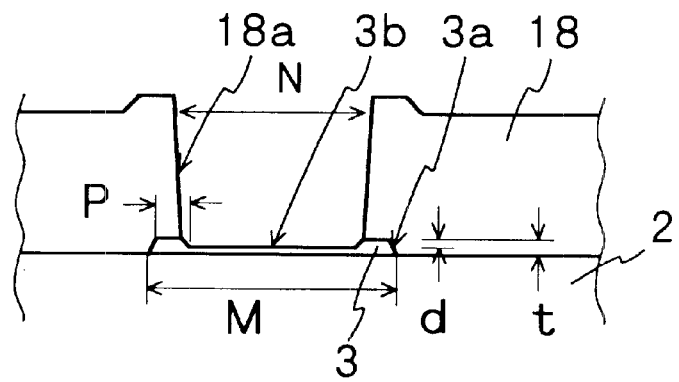
FIG. 3 is a explanatory view at the time of forming a recessed part in the mask layer of FIG. 1.

As shown in FIG. 3 showing the explanatory sectional view of a recessed part at the time of formation thereof, the recessed parts 3b formed on the surface of the mask layer 3 are formed to have the depth d about a half thickness t of the mask layer 3, in other words about 100 nm depth d, by forming a resist film 18 in the entire surface on the mask layer 3 after the opening parts 3a are formed, forming opening parts 18a with the width N of about 16 $\mu$m in the resist film 18 by patterning, and then carrying out etching with an aqueous HF type solution. Consequently, while leaving the portions about 2 $\mu$m width P from both end parts of the mask layer 3, the recessed part 3b are formed on the surface and in the inner side.

The width P left in both ends are adjusted to be about 2 $\mu$m in consideration of the precision of the mask alignment and it is left in order to prevent growth. continuously to the insides of the recessed parts 3b from the opening parts 3a and therefore, it is sufficient to keep the growth starting position in the lateral direction at a higher position than most parts of the surface of the mask layer 3 and to keep a gap between most parts of the surface and the second semiconductor layer 4 to be grown in the lateral direction. For that, other than the recessed parts 3b formation, any structure, e.g. projections formed in the opening parts 3a side, can be applicable as long as the structure is suitable to keep a gap approximately parallel to the second semiconductor layer 4. Also, the depth of the recessed parts 3b (the height in case of forming projections in both end parts) is sufficient if it is enough to form steps to prevent contact stress from affecting between the mask layer and the second semiconductor layer 4 to be grown in the lateral direction. Due to that, the recessed parts 3b may be formed in the depth to the extent that the second semiconductor layer 4 is allowed to be slightly formed in the bottom face side and formed on the almost surface of the mask layer 3 in the ultimately allowable positioning relation without leaving gaps, however taking the dispersion in fabrication conditions, the depth is preferable to be about 100 nm as described before.

The second nitride type compound semiconductor layer 4 is, for example, an about 20 μm-thick non-doped GaN layer. The semiconductor layer 4 is started growing while using the first GaN layer 2 exposed to the opening parts 3a of the mask layer 3 as a seed and selectively grown in the lateral direction when it reaches the surface of the mask layer 3. That is, since GaN layer is grown faster with more excellent crystallinity in the lateral direction than in the vertical direction, although the recessed parts 3b are formed in the mask layer 3, the layer is scarcely grown in the lower side but grown in the lateral direction while keeping gaps 3c to the mask layer 3 and also grown slightly in the upper side and finally joined to itself around the center parts of the mask layer 3 while being grown in the lateral direction in both ends of each opening part. Then, after the surface of the mask layer 3 are completely buried, the second GaN layer (a semiconductor layer) 4 is grown upward to completely cover the mask layer 3. The resultant second GaN layer 4 has excellent crystallinity in the portions other than the portions in both end parts of the mask layer 3 (the portions contacting the opening parts 3a) and the joining parts in the center parts and the dislocation density is lowered by one figure.

As shown in FIG. 1, the semiconductor layered part 15 on the second GaN layer 4 is so formed to be a semiconductor layered part as to constitute a common semiconductor laser structure. That is, the layered part 15 is formed by successively laminating an about 0.5 μm thick n-type contact layer 5 of n-type GaN doped with, for example, Si of about $5 \times 10^{18}$ cm$^{-3}$, an about 0.4 μm thick n-type clad layer 6 of n-type $Al_{0.08}Ga_{0.92}N$ doped with, for example, Si of about $5 \times 10^{18}$ cm$^{-3}$, an about 0.2 μm thick n-type first guide layer 7 of n-type GaN doped with, for example, Si of about $1 \times 10^{18}$ cm$^{-3}$, an about 50 nm thick n-type second guide layer 8 of n-type $In_{0.01}Ga_{0.99}N$ doped with, for example, Si, an about 50 nm-thick active layer 9 having a multiple quantum well (MQW) structure comprising 5 well layers of about 5 nm-thick $In_{0.1}Ga_{0.9}N$ successively and reciprocally stacked on about 5 nm-thick barrier layers of $In_{0.02}Ga_{0.98}N$, an about 20 nm thick p-type cap layer 10 of $Al_{0.2}Ga_{0.8}N$ doped with, for example, Mg, an about 0.1 μm thick p-type guide layer 11 of GaN, doped with, for example, Mg of about $1 \times 10^{18}$ cm$^{-3}$, an about 0.4 μm thick p-type clad layer 12 of $Al_{0.08}Ga_{0.92}N$ doped with, for example, Mg of $2 \times 10^{17}$ cm$^{-3}$, and an about 0.1 μm thick p-type contact layer 13 of GaN doped with, for example, Mg of about $3 \times 10^{18}$ cm$^{-3}$.

The structure of the semiconductor layered part 15 and the material for each layer are not at all restricted to those exemplified above and the active layer 9 may not be a quantum well structure but be a bulk structure and the active layer 9 of a material determined by the desired wavelength of emitted light is so composed as to be sandwiched between clad layers 6, 12 made of materials having band gaps wider than that of the active layer 9. In case of composing a semiconductor laser as shown in FIG. 1, the active layer 9 is made of a material having a refractive index higher than those of the materials for the clad layers 6, 12. Owing to that, light can be closed in the active layer 9 and if the active layer 9 is thin and cannot sufficiently close the light, as shown in FIG. 1, light guide layers 7, 8, 11 having refractive indexes between that of the active layer 9 and those of the clad layers 6, 12 are formed. However, if the active layer 9 is capable of sufficiently close light, it is no need to form the light guide layers 7, 8, 11.

The p-type contact layer 13, the uppermost layer of the semiconductor layered part 15, is subjected to mesa-etching, and a part of the semiconductor layered part 15 is etched to expose the n-type contact layer 5, and a $SiO_2$ film is formed on the entire surface to form the protective film 14. After that, the p-side electrode 16 of Ni—Au is formed on the mesa part of the p-type contact layer 13 through the contact hole of the protective film 14 and the n-side electrode 17 of Ti—Al is formed as being electrically connected with the n-type contact layer. Finally, the resultant layered structure is cleaved as to have resonance length of 500 μm (the length in the perpendicular direction to the sectional plane of FIG. 1) and compose the laser (LD) chip shown in FIG. 1.

With this layered structure, the mesa-type parts in stripes of the p-type contact layer 13 become current injection regions (in the case where the p-side electrode is formed in stripes, stripe type current injection region is formed even if the contact layer 13 is not formed to be mesa type) and the mask layer 3 and the p-side electrode 16 are formed while being conformed to each other as to position a half or less of the stripe type recessed part 3b formed on the mask layer 3.

According to the present invention, in the case where the nitride type compound semiconductor layer is grown by selective growth in the lateral direction on the mask layer, since the recessed parts are formed in the surface of the mask layer, even if the semiconductor layer is grown on the mask layer by selective growth of the semiconductor layer, the layer growth is promoted in the lateral direction while leaving gap to the mask layer and therefore, no contact stress affect between the mask layer and the semiconductor layer during the growth. Consequently, the crystallographic axis of the grown semiconductor layer is prevented from being curved by the stress and a flat semiconductor layer is grown in a long width. (Even if a gap is not formed, formation of the recessed part prevents the contact stress from affecting between the selectively grown semiconductor layer and the mask layer.) Further, since the growth is in the lateral direction, the dislocation density is as low as $5 \times 10^6$ cm$^{-2}$, which is low by one order as compared with that in a conventional one to form a semiconductor layer with excellent crystallinity and flatness in a wide range.

Figure 5:
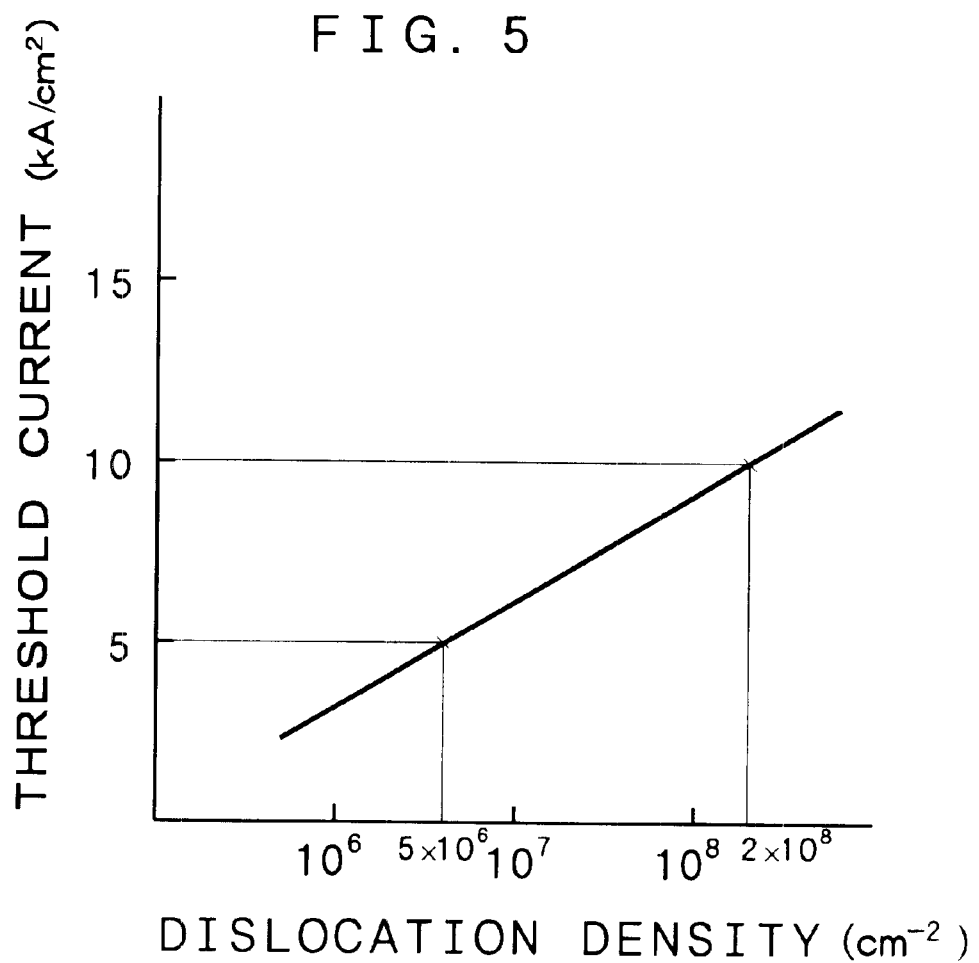
FIG. 5 is a graph showing the alteration of the threshold current of the semiconductor laser of the present invention in relation to the dislocation density.

As shown in the example of FIG. 1, the recessed part to be formed in the mask layer is formed in stripe and the semiconductor layered part is formed on them within a half width of the recessed part as to form current injection region, so that light emission is enabled to take place only in the portions of the semiconductor layered part with significantly excellent crystallinity and flatness. So, even if semiconductor layered part with excellent crystallinity and flatness cannot be formed in the entire surface of a wide range, a semiconductor laser with a low threshold current value and a high oscillation output can be obtained. That is, as the correlation of the dislocation density and the threshold current value is shown in the graph of FIG. 5 of the semiconductor laser with the structure of FIG. 1, the dislocation density is lowered to $5 \times 10^6$ cm$^{-2}$ from $2 \times 10^8$ cm$^{-2}$ and the threshold current value is also lowered to 5 kA/cm$^2$ from 10 kA/cm$^2$ according to the present invention.

In other words, even in the selective growth in the lateral direction using a mask, the first semiconductor layer to be a seed has inferior crystallinity and a high dislocation density in the opening parts of the mask, so that the semiconductor layer to be grown thereon also has a high dislocation density and inferior crystallinity. Further, if the width of mask layer is wide, it is harder to keep the flatness as it goes closer to the center part of the mask layer and the crystallinity of the semiconductor layer in the joining portion grown from both sides of the opening parts is lowered to make it difficult to obtain the semiconductor layer with excellent crystallinity and flatness in the entire face of a wide surface area. However, by adopting the foregoing constitution, the stripe-like resonator portion, which is the light emitting portion of the semiconductor laser, can be grown on the semiconductor layer with excellent crystallinity and flatness to make it possible to obtain the semiconductor laser comprising the semiconductor layered part with excellent crystallinity grown in the resonator portion and provided with a low threshold current value.

Next, the method for fabricating (manufacturing) such a semiconductor laser will be described. Using an epitaxial growth apparatus by, for example, MOCVD method, a substrate is thermally cleaned in $H_2$ gas atmosphere at 1100° C. substrate temperature. After that, triethylgallium (TEG) as a Ga raw material gas and ammonia ($NH_3$) as a N raw material gas are introduced to grow a non-doped first GaN layer 2 in about 4 $\mu$m thickness. Then, the resultant substrate is taken out the growth apparatus and using, for example, a sputtering apparatus, a $SiO_2$ film in about 200nm thickness is formed thereon. After that, a resist layer is formed on the $SiO_2$ film, patterned, and the $SiO_2$ film is etched using an aqueous HF solution to form stripe type opening parts and to form stripe type mask layer 3. Moreover, as shown in FIG. 3, a resist film 18 is formed on the entire surface and patterned to form opening in the portion where the recessed parts 3b is to be formed. Then, etching with an aqueous HF solution is again carried out to form stripe type recessed part 3b (in the perpendicular direction to the sectional plane of FIG. 3) as shown in FIG. 3.

After that, the resultant substrate is again put in a growth apparatus such as a MOCVD apparatus and necessary gases such as trimethylaluminum (TMA) and trimethylindium (TMIn) as raw material gas of Al and In, respectively, as well as the foregoing gases, $SiH_4$ as the n-type dopant or cyclopentadienyl magnesium ($Cp_2Mg$) or dimethyl zinc (DMZn) as p-type dopant are introduced together with carrier gas to grow the second GaN layer 4 and respective semiconductor layers of the semiconductor layered part 15 in respectively above described thickness. In this case, the first n-type guide layer 7 and those before the layer 7 are grown at the substrate temperature of 1050° C. and the second n-type guide layer 8 and the active layer 9 are grown at the substrate temperature of 770° C. and the respective layers after these are grown again at the substrate temperature of 1050° C.

Figure 4:
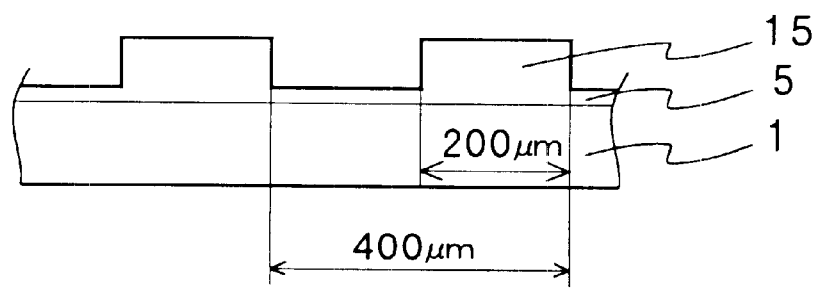
FIGS. 4(a) and 4(b) are explanatory views of pattern examples formed by etching the semiconductor layered part after laminating the semiconductor layers.
Figure 4:
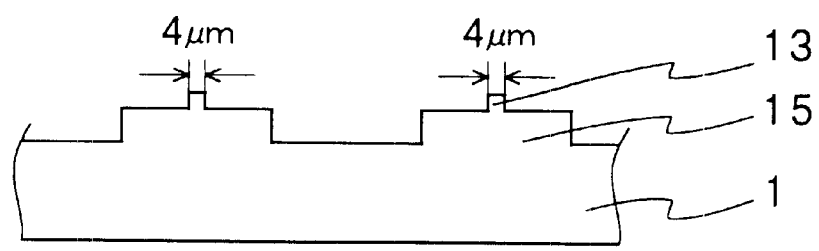

On completion of the growth of the respective semiconductor layers, the substrate is taken out of the growth apparatus and a resist mask is put on the surface, a part of the semiconductor layered part 15 is etched by a Reactive Ion Beam Etching (RIBE) apparatus in 200 $\mu$m width in the cycle of 400 $\mu$m as shown in FIG. 4(a) to expose some of n-type contact layer 5. Further, the resist mask is removed and then another resist mask is put again, mesa etching is carried out by the same apparatus as to leave the p-type contact layer 13 in about 4 $\mu$m width as shown in FIG. 4(b). After that, using a film growth apparatus such as a plasma CVD, a protective film 14 of such as $SiO_2$ is formed in about 200 nm thickness on the entire surface and the parts where electrodes are to be formed are etched by a HF-type etchant to form contact holes.

After that, as the p-side electrode 16, a Ni film of 100 nm thickness and a Au film of 200 nm thickness are formed respectively by a vacuum evaporation apparatus and further as the n-side electrode 17, a Ti film of 100 nm thickness and an Al film of 200 nm are formed to obtain the electrodes 16, 17 and the rear side of the resultant substrate 1 is polished to be as thin as about 60 $\mu$m and cleave as to keep the resonance length of about 500 $\mu$m to complete a LD chip.

Although the foregoing exemplified one is a semiconductor laser with the stripe structure in which the p-type contact layer 13 is simply mesa type stripes, it may be sufficient to form only the p-side electrode in stripe without etching the contact layer or to form mesa type structure almost near to the active layer or to form a proton implanted type structure by implanting protons. Further, the semiconductor laser may be formed in an index guiding structure in which the current blocking layer is buried. Further, although the foregoing example is an example of the semiconductor laser, even in case of a light emitting diode (LED), a semiconductor layer with excellent crystallinity can be formed in a wide range according to the present invention and even if there are some portions where the dislocation density is high, the ratio of the portions in the entire light emitting part is low, so that the light emitting efficiency is improved.

According to the present invention, a semiconductor layer with a low dislocation density can be formed in a wide range and in the case, a semiconductor laser is formed by forming the opening parts in a mask as described above, there is apt to occur a problem that a wafer is easy to be warped. The following is the description of a method for fabricating a semiconductor light emitting device and a semiconductor laser while solving the problem.

A semiconductor light emitting device and its fabrication method of another embodiment of the present invention is characterized in that, in the case where the semiconductor layer is deposited by selectively growing a nitride type compound semiconductor on a wafer type substrate by the ELO growth and composing light emitting layer part thereon, the mask pattern for selective growth in the lateral direction is so formed as to have most of the opening parts symmetric n (the reference character n denotes an integer of 2 or higher) times (that means the structure becomes symmetric n times in rotation at 180°) as the example of the mask pattern of one embodiment shown in FIG. 6(a), but not formed as to have opening parts exposing the seed to be only a pattern continuous in one single direction in the entire surface of the wafer type substrate.

Using such a mask, a nitride type compound semiconductor layer is formed on the entire surface of the wafer type substrate by carrying out selective growth in the lateral direction from the opening parts on the mask layer and nitride type compound semiconductor layers are stacked as to form light emitting layer and form semiconductor layered part and then the resultant substrate is cut and broken into chips to obtain a semiconductor light emitting device.

The example shown in FIG. 6(a) shows an example of a pattern formed by layering patterns each obtained by rotating one pattern at 60° and at 120° on the original pattern having linear opening parts and made symmetric three times. As a result, as shown in FIG. 6(b) which is magnified, the opening parts of each hexagonal shape dispersedly exist and are arranged at every 60° but do not form opening parts continuous only in one direction.

As described above, since a wafer tends to be warped to result in deterioration of properties and damage at the time of handling in case of growing a nitride type compound semiconductor layer in the thickness of about 10$\mu$m or more by the ELO growth on a sapphire substrate, inventors of the present invention have enthusiastically made investigations in order to avoid warp of a wafer even in case of growing thick semiconductor layer, and found that there is correlation between the warp and the direction of the opening parts to be a seed in the mask.

Figure 9:
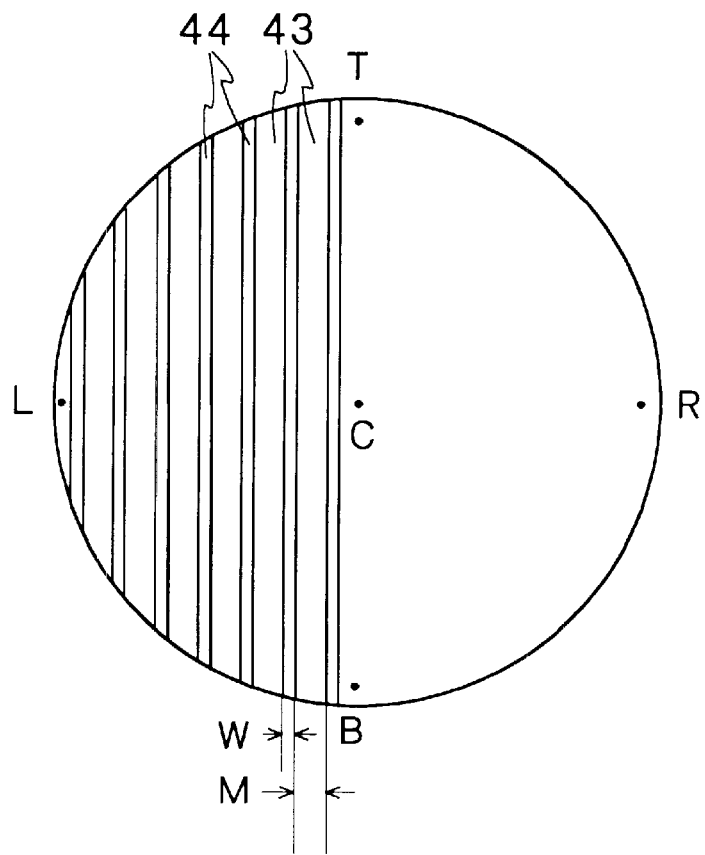
FIG. 9 is an example of a pattern preferable for growing a semiconductor layer with a small dislocation density in the entire body of a stripe type light emitting part of an LD and a view illustrating the warping state in this case.
Figure 10:
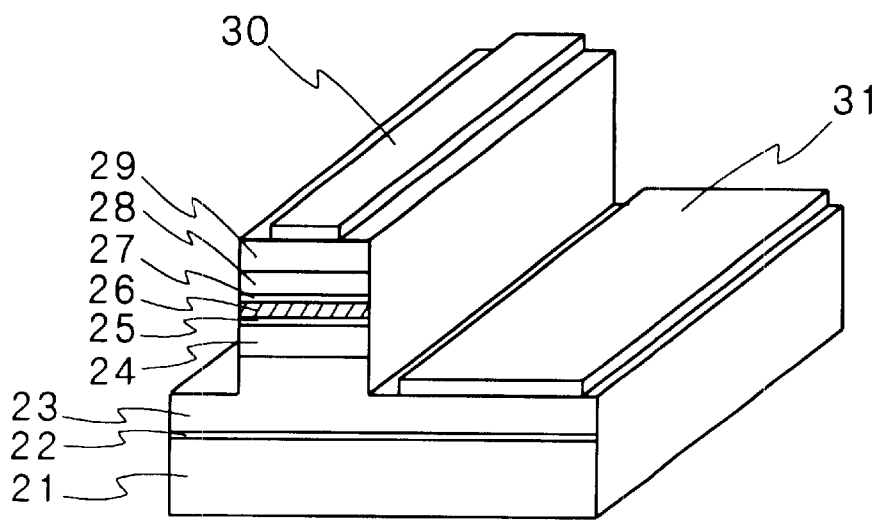
FIG. 10 is a explanatory sectional view showing one example of a conventional blue-emitting type semiconductor laser.
Figure 11:
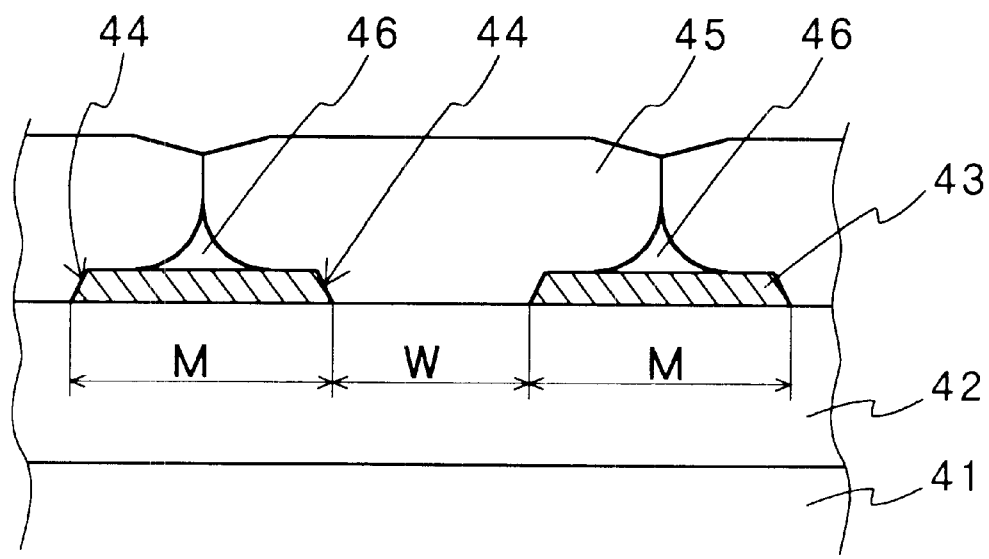
FIG. 11 is a explanatory view showing the correlation between mask layer and opening parts in case of selective growth in lateral direction using a conventional mask layer.

That is, even in case of a semiconductor layer grown by the ELO growth, the threading dislocation of an underlayer is inherited on the opening parts, so that the threading dislocation remains in the semiconductor layer at the portion corresponding to the opening parts, and it is known well that, in the center part of the mask where the layer grown in both directions is joined to itself, the dislocation density is increased. So if it is no need to emit light in the whole area of a chip just in case of a semiconductor laser but is sufficient to emit light only in stripe-like part, it is preferable to include no such opening part and joined part where the dislocation density is high in the light emitting part in stripe. From a viewpoint of that, as shown in FIG. 9, the warping degrees between the top part and the center (T–C) and between the bottom part and the center (B–C) in FIG. 9 are 300$\mu$m, respectively, in case of growing a 24$\mu$m-thick GaN layer on a 2 inch wafer of a 330 $\mu$m-thick sapphire substrate by ELO growth using a mask layer having opening parts 44 only in only one direction on the wafer, whereas the warping degrees between the left side and the center (L–C) and between the right side and the center (R–C) are 40 $\mu$m, respectively, to make it clear that there is a close relation between the direction of the opening parts and the warping.

Incidentally, in case of ELO growth in 4 $\mu$m thickness, the warping is about 40 $\mu$m in any direction, and in case of 700 $\mu$m thickness of the substrate, even if the growth thickness is 24 $\mu$m, the warping degrees in the foregoing respective directions are 50 $\mu$m and 20 $\mu$m, respectively, however, the warping similar to that described above is caused by making the substrate thin to about 300 $\mu$m before the resultant substrate is finally cut (cleaved) into chips. On the other hand, in case of ELO growth of a 24 $\mu$m-thick GaN semiconductor layer using the mask with the pattern shown in FIG. 6(a), the warping degrees are 60 $\mu$m in the foregoing (T–C, B–C) direction and (L–C, R–C) directions. That is, if using the mask layer having the opening parts in the pattern shown in FIG. 6(a), the warping degrees are slightly increased, however they are significantly decreased as compared with those in case of using a conventional mask layer having opening parts formed only in one direction.

Figure 6:
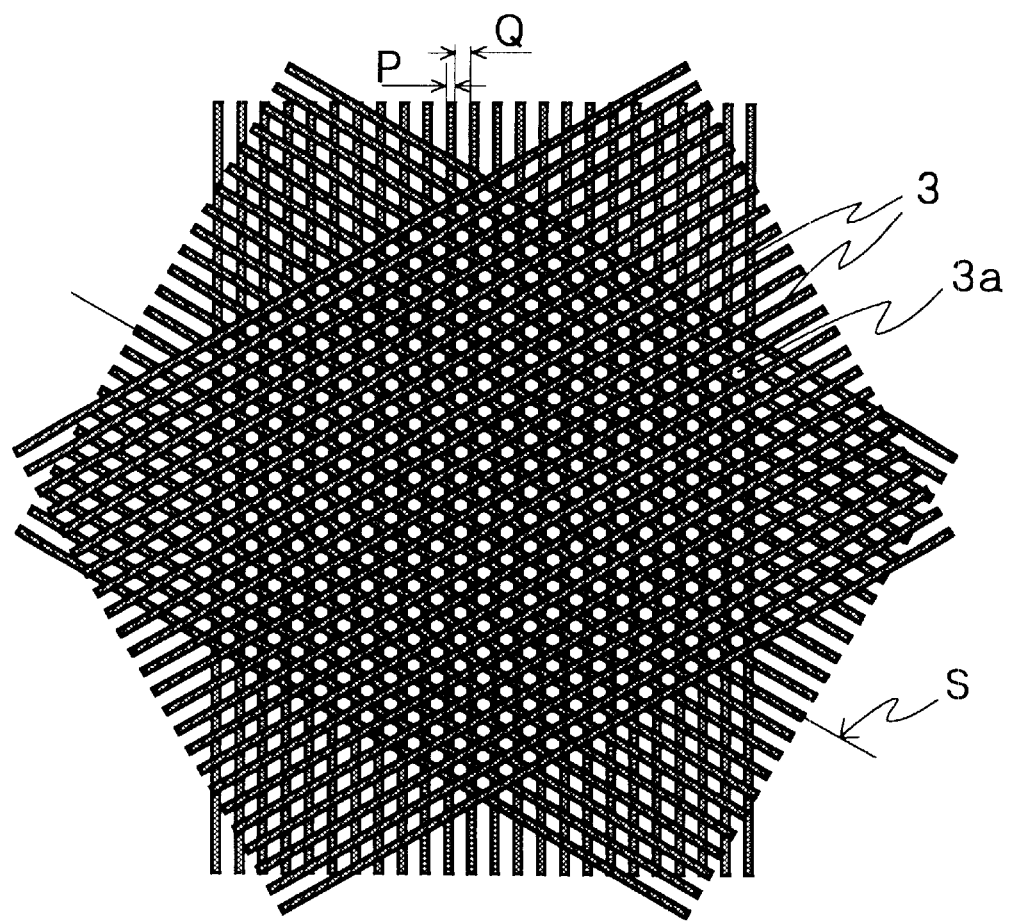
FIGS. 6(a) and 6(b) are examples of mask pattern to be employed for a method of fabricating another embodiment of a semiconductor light emitting device according to the present invention.
Figure 6:
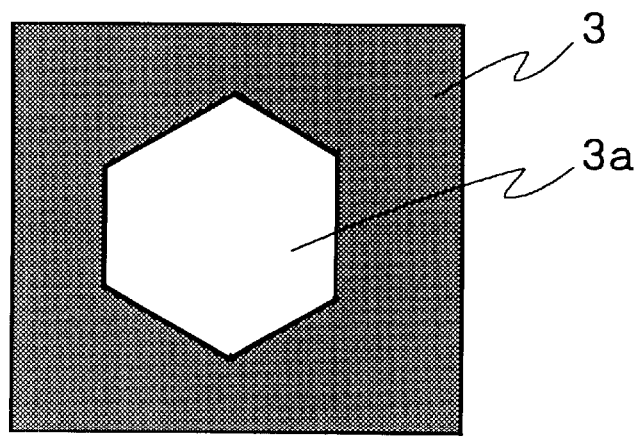

The pattern shown in FIG. 6(a) is formed by respectively overlaying a first pattern having periodically formed linear pattern parts P with 20 to 30 $\mu$m width and linear opening parts Q with 10 to 20 $\mu$m width (in FIG. 6, although P is shown narrower than Q, that is only to show the opening parts clearly and actually, P is 1 to 3 times as wide as Q), a second pattern which is the first pattern rotated at 60 degrees, and a third pattern which is the first pattern rotated at 120 degrees and the resultant opening parts 3a are hexagonal (not necessarily needed to be right hexagonal) as shown in FIG. 6(b). Since a nitride type compound semiconductor layer grown from the opening parts 3a on the mask 3 in the lateral direction is hexagonal system, the growth can be promoted in a constant ratio in the opening parts in any direction.

As a result, the joined part of the semiconductor layer grown in the lateral direction from a plurality of opening parts becomes point and the dislocation density in the joined part is scarcely increased. Hence, as shown as S in FIG. 6(a), stripe type light emitting part with a low dislocation density can be obtained by forming the stripe type light emitting part on the part of mask 3 which is without transversely crossing the opening parts 3a and in the half region avoiding the center part of the mask width P.

The semiconductor laser chip (LD) having light emitting part in stripe formed in such portion where the dislocation density is extremely low has a similar structure as the foregoing structure shown in FIG. 1. That is, the semiconductor laser in this example, comprises a mask layer 3 having opening parts 3a formed directly on a substrate 1 or on a first nitride type compound semiconductor layer 2 deposited on the substrate 1, a second nitride type compound semiconductor layer 4 formed on the mask layer 3 by being selectively grown in the lateral direction from the foregoing opening parts 3a, and a semiconductor layered part 15 composed of laminated nitride type compound layers as to form light emitting layer having stripe type light emitting part. The mask layer 3 is so formed as to be extended in the whole length of chips without transversely crossing the opening parts under the stripe type light emitting part and the opening parts 3a dispersedly exist in the portions other than the portion above which the stripe type light emitting part is formed.

Regarding this example, the structures, the materials, and the production methods of the substrate 1, the second nitride type compound semiconductor layer 4, the semiconductor layered part 15, the contact layer 13 formed thereon, the electrodes, and the like are same as those of the foregoing example shown in FIG. 1 except that the mask layer 3 is formed as to have the shape shown in FIG. 6(a) and therefore their description is omitted.

Further, the laser structure may be formed to be a structure in which only the electrode is in stripe without etching the contact layer, be a mesa type structure formed almost near to the active layer, be a proton-implanted type, or be another structure such as an index guiding structure in which current blocking layer is formed.

According to the present example, since the nitride type compound semiconductor layer part with a small dislocation density is formed linearly without transversely crossing the opening parts, and the semiconductor layered part as to form a light emitting part in stripe is formed in the portion where the dislocation density is low, while eliminating warping of the wafer by not forming the opening parts continuous only in one direction, the stripe type resonance part where semiconductor laser is oscillated can be formed on the semiconductor layer with excellent crystallinity and flatness and the semiconductor layered part of the resonance part is also grown with excellent crystallinity to give a semiconductor laser with a low threshold current value and excellent properties. Moreover, the entire surface of the wafer can be utilized to avoid vain use of a half or more of the substrate. Further, by forming the recessed part on the surface of the mask layer, no contact stress affect between the mask layer and the semiconductor layer at the time of semiconductor layer growth and the crystallographic axis of the semiconductor layer is not curved by the stress to grow a flat semiconductor layer in a wide width.

Figure 7:
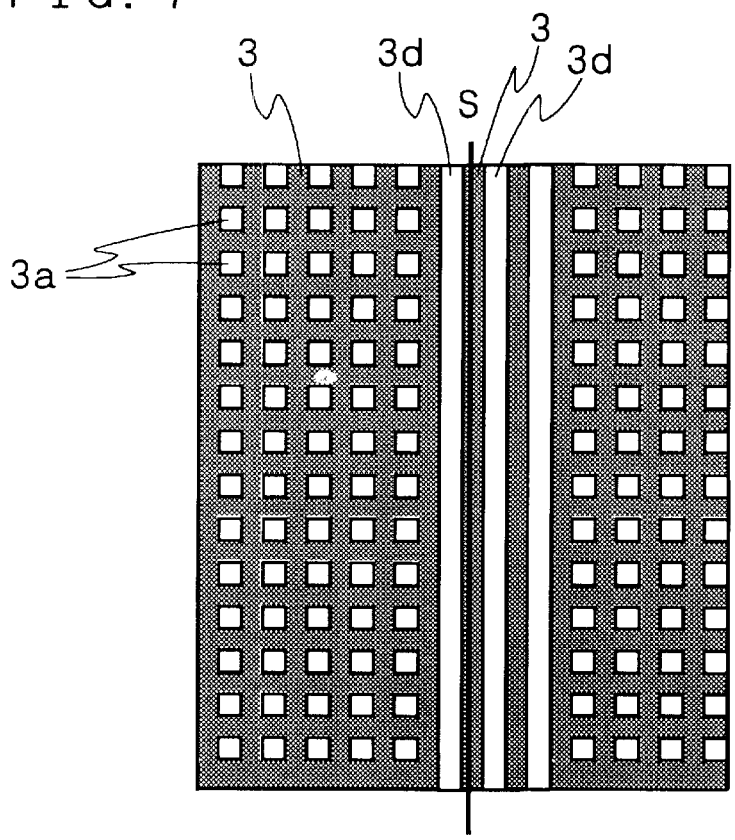
FIG. 7 is another example of a mask pattern suitable for a semiconductor laser according to the present invention.
Figure 8:
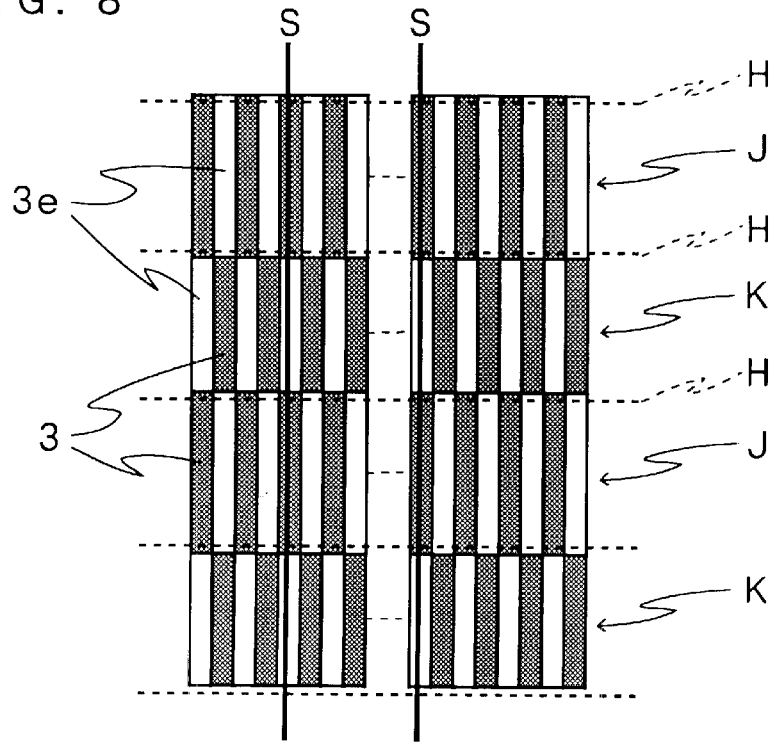
FIG. 8 is further another example of a mask pattern suitable for a semiconductor laser according to the present invention.

Other examples shown in FIG. 7 and FIG. 8 are mask patterns capable of suppressing the wafer warp while forming light emitting region with a small dislocation density in the whole region in the stripe type light emitting part of an LD without transversely crossing the opening portions with a high dislocation density. That is, in the example shown in FIG. 7 the linear mask layer 3 sandwiched between neighboring linear opening parts 3d is the portion corresponding to the stripe type light emitting part S and other parts of the mask layer 3 are formed in a lattice-like shape and rectangular opening parts 3a are formed like a matrix. As a result, in a wafer, although the linear opening parts penetrate the wafer in the stripe type light emitting part S, but the opening parts 3a are formed in both vertical and lateral directions in other parts, so that warping does not take place only in one direction and warping of the wafer can be suppressed. Incidentally, although the intervals (the mask width) of the rectangular opening parts 3a are shown at the same intervals in the vertical and lateral direction in FIG. 7, the intervals can be adjusted corresponding to the difference of the growth rate. Further, another linear mask part, which is formed adjacently to the stripe type light emitting part S, is to increase the rate in the lateral direction in the periphery of the light emitting part and it may be only one stripe type light emitting part S.

Whereas the foregoing example is an example in which the pattern of one chip is repeated in the same shape in a wafer (only the pattern of one chip is shown in FIG. 7), the example shown in FIG. 8 is an example of pattern shutting the continuity among pattern of respective chips. That is, one chip has a structure in which opening parts are formed in parallel to the stripe type light emitting part S, however this pattern is formed as to reverse the mask parts 3 and the opening parts 3e in the region J to be used as chips and the neighboring region K not to be used as chips. At the time of producing chips from the wafer, the wafer is cut along the dotted line H to produce LD chips in the region J, whereas the region K is discarded. Also in this pattern, since the opening parts are not linearly continuous, the wafer warp can be suppressed. Incidentally, the region K is to be discarded and therefore preferable to be short and even if the region K is shortened to be about a half of the length of the region J, the warp of the wafer is scarcely affected. In case of an LED, since it is no need to cut, even the region K can be used and the wafer is not at all used in vain.

According to the present invention in which recessed parts are formed in the mask layer, even if the width of the mask is widened, the crystallographic axis of the semiconductor layer selectively grown in the lateral direction thereon is not curved and while keeping a low dislocation density attributed to the selective growth in the lateral direction, the flatness of the semiconductor layer can be maintained, so that a nitride type compound semiconductor layer with excellent crystallinity and flatness can be formed in a wide range and a nitride type compound semiconductor light emitting device such as a blue-emitting type semiconductor light emitting device can be obtained. Especially, application of the present invention to a blue-emitting type semiconductor laser using nitride type compound semiconductor makes it possible to obtain a semiconductor laser with a low threshold current value.

Further, according to the present invention in which the pattern of the mask layer is innovative, since the opening parts of the mask layer are not composed of opening parts continuous only in one direction, even if the mask width is widened and the thickness of the semiconductor layer to be grown thereon is required to be thick, no warp of the wafer is caused. Consequently, a semiconductor light emitting device with excellent quality can be obtained at a low cost without any bad effect on the handling and device properties in the wafer processing process.

Furthermore, in the semiconductor laser of the present invention, while the stripe type light emitting part does not at all include parts with a large dislocation density and comprise the semiconductor layered part with few crystal defects in the light emitting portion, there is no linear opening part extended only in one direction in portions other than the peripheral parts of the stripe type light emitting part, therefore, even if a thick nitride type compound semiconductor layer is grown, there takes place no problem in the wafer state. Moreover, the substrate can efficiently be used and the fabrication cost can be lowered. As a result, a semiconductor laser with a low threshold value and excellent properties can be obtained at a low cost.

Although preferred examples have been described in some detail it is to be understood that certain changes can be made by those skilled in the art without departing from the spirit and scope of the invention as defined by the appended claims.

What is claimed is:

1. A nitride type compound semiconductor light emitting device comprising:

a substrate, a mask layer having opening parts and formed directly on said substrate or on a layer formed on said substrate, a nitride type compound semiconductor layer selectively grown in the lateral direction on said mask layer from the opening parts, and a semiconductor layered part comprising nitride type compound semiconductor layers so formed on said nitride type compound semiconductor layer as to form light emitting layer, wherein said mask layer is provided with at least one recessed part on the upper face side.

2. A nitride type compound semiconductor light emitting device comprising:

a substrate, a mask layer having opening parts and formed directly on said substrate or on a layer formed on said substrate, a nitride type compound semiconductor layer selectively grown in the lateral direction on said mask layer from the opening parts, and a semiconductor layered part comprising nitride type compound semiconductor layers so formed on said nitride type compound semiconductor layer as to form light emitting layer, wherein the bottom face side of said nitride type compound semiconductor layer is made flat and said nitride type compound semiconductor layer is grown as to keep a gap approximately parallel between the bottom face of said nitride type compound semiconductor layer and said mask layer.

3. The semiconductor light emitting device as claimed in either claim 1 or claim 2, wherein the layer to be formed on said substrate is a first nitride type compound semiconductor layer and said nitride type compound semiconductor layer formed on said mask layer is a second nitride type compound semiconductor layer.

4. A semiconductor laser which is the nitride type compound semiconductor light emitting device as claimed either in claim 1 or claim 2, wherein said semiconductor layered part is laminated so as to constitute a semiconductor laser structure, said mask layer has a part extended in stripe by being sandwiched between neighboring opening parts, said recessed part or said gap is formed in a prescribed width along the stripe in said part extended like stripe, and said semiconductor layered part is so formed that a current injection region in stripe is formed in a constant width within a half of said prescribed width.

5. The semiconductor laser of claim 4, wherein said part extended in stripe in said mask layer does not transversely cross said opening parts and is formed in the entire length of the chip, and said opening parts are dispersedly formed in said mask layer other than said part extended in stripes.

6. The semiconductor laser of claim 5, wherein said opening parts in said mask layer are formed linearly along said part extended in stripe in the portions adjacent to said part extended in stripe and formed in a matrix-like state or randomly in the portions other than the portions adjacent to said part extended in stripes.

7. The semiconductor laser of claim 5, wherein said mask layer is formed in shape symmetric three times by overlaying a first pattern having linear opening parts, a second pattern formed by rotating said first pattern at 60°, and a third pattern formed by rotating said first pattern at 120°.

8. A semiconductor laser comprising:

a substrate, a mask layer having opening parts and formed directly on said substrate or on a layer formed on said substrate, a nitride type compound semiconductor layer selectively grown in the lateral direction on said mask layer from said opening parts, and a semiconductor layered part comprising nitride type compound semiconductor layers so formed on said nitride type compound semiconductor layer as to form a light emitting layer having a stripe type light emitting part, wherein said mask layer has a part extended in the whole length of the chip without transversely crossing said opening parts under said stripe type light emitting part, and has said opening parts formed dispersedly in the portions other than the portions under said stripe type light emitting part.

9. The semiconductor laser of claim 8, wherein said opening parts of said mask layer are formed linearly along said stripe type light emitting part in the portions adjacent to said stripe type light emitting part and formed in a matrix-like state or randomly in the portions other than the portions adjacent to said stripe type light emitting part.

10. The semiconductor laser of claim 8, wherein said mask layer is formed in shape symmetric three times by overlaying a first pattern having linear opening parts, a second pattern formed by rotating said first pattern at 60°, and a third pattern formed by rotating said first pattern at 120°.

* * * * *